United States Patent
Borodulin et al.

(10) Patent No.: US 9,257,647 B2
(45) Date of Patent: Feb. 9, 2016

(54) PHASE CHANGE MATERIAL SWITCH AND METHOD OF MAKING THE SAME

(71) Applicants: Pavel Borodulin, Baltimore, MD (US); Nabil Abdel-Meguid El-Hinnawy, Columbia, MD (US); Robert Miles Young, Ellicott City, MD (US); Robert S. Howell, Silver Spring, MD (US); John R. Mason, Jr., Linthicum, MD (US); Brian Paul Wagner, Baltimore, MD (US); Matthew Russell King, Elkridge, MD (US); Evan B. Jones, Linthicum, MD (US); Michael J. Lee, Linthicum, MD (US); Marc Eisenzweig Sherwin, Catonsville, MD (US)

(72) Inventors: Pavel Borodulin, Baltimore, MD (US); Nabil Abdel-Meguid El-Hinnawy, Columbia, MD (US); Robert Miles Young, Ellicott City, MD (US); Robert S. Howell, Silver Spring, MD (US); John R. Mason, Jr., Linthicum, MD (US); Brian Paul Wagner, Baltimore, MD (US); Matthew Russell King, Elkridge, MD (US); Evan B. Jones, Linthicum, MD (US); Michael J. Lee, Linthicum, MD (US); Marc Eisenzweig Sherwin, Catonsville, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 289 days.

(21) Appl. No.: 13/828,351

(22) Filed: Mar. 14, 2013

(65) Prior Publication Data
US 2014/0264230 A1 Sep. 18, 2014

(51) Int. Cl.
*H01L 45/00* (2006.01)

(52) U.S. Cl.
CPC ............ *H01L 45/1625* (2013.01); *H01L 45/06* (2013.01); *H01L 45/1206* (2013.01); *H01L 45/1226* (2013.01); *H01L 45/1286* (2013.01); *H01L 45/144* (2013.01); *H01L 45/1641* (2013.01); *H01L 45/1666* (2013.01)

(58) Field of Classification Search
CPC .................. H01L 2924/0002; H01L 2924/00; H01L 23/5256; H01L 45/06; H01L 45/1206; H01L 45/1226; H01L 45/1286; H01L 45/144; G11C 13/0004
See application file for complete search history.

(56) References Cited

U.S. PATENT DOCUMENTS

| | | | | | |
|---|---|---|---|---|---|
| 4,539,616 | A | * | 9/1985 | Yuito | G11B 5/17 29/603.25 |
| 5,834,329 | A | * | 11/1998 | Kim | H01S 5/22 438/38 |
| 6,174,175 | B1 | * | 1/2001 | Behfar | H01R 12/714 439/91 |
| 6,248,655 | B1 | * | 6/2001 | Machida | G01B 7/004 438/597 |
| 6,448,576 | B1 | * | 9/2002 | Davis et al. | 257/50 |
| 6,802,598 | B2 | * | 10/2004 | Ito | B41J 2/14201 347/71 |
| 6,953,999 | B2 | * | 10/2005 | Strandberg | H01L 23/13 257/778 |
| 7,094,705 | B2 | * | 8/2006 | Lin | H01L 21/321 257/E21.3 |
| 7,105,377 | B1 | * | 9/2006 | Chang | H01L 21/67121 257/798 |
| 7,192,880 | B2 | * | 3/2007 | Dostalik, Jr. | H01L 21/31116 257/E21.024 |
| 7,485,968 | B2 | * | 2/2009 | Enquist | H01L 21/76898 257/777 |

(Continued)

OTHER PUBLICATIONS

Wen, et al.: "*A Phase-Change Via-Reconfigurable On-Chip Inductor*", IEEE 2010, IEDM10-237 thru IEDM10-240.

(Continued)

*Primary Examiner* — Stephen W Smoot
*Assistant Examiner* — Edward Chin
(74) *Attorney, Agent, or Firm* — Tarolli, Sundheim, Covell & Tummino LLP

(57) ABSTRACT

A phase change material (PCM) switch is disclosed that includes a resistive heater element, and a PCM element proximate the resistive heater element. A thermally conductive electrical insulating barrier layer positioned between the PCM heating element and the resistive heating element, and conductive lines extend from ends of the PCM element and control lines extend from ends of the resistive heater element.

23 Claims, 12 Drawing Sheets

(56) References Cited

U.S. PATENT DOCUMENTS

| | | | | |
|---|---|---|---|---|
| 7,634,248 B2* | 12/2009 | Xu et al. | | 455/334 |
| 7,736,973 B2* | 6/2010 | Orimoto | | H01L 27/11521 257/E21.68 |
| 7,781,781 B2* | 8/2010 | Adkisson | | H01L 27/14618 257/84 |
| 7,825,511 B2* | 11/2010 | Daubenspeck | | H01L 23/3192 257/737 |
| 7,893,435 B2* | 2/2011 | Kazlas | | G02F 1/133305 257/59 |
| 8,084,319 B2* | 12/2011 | Peng | | B81C 1/00071 438/223 |
| 8,242,024 B2* | 8/2012 | Chen | | H01L 21/76816 438/712 |
| 2003/0219987 A1* | 11/2003 | Wang | | H01L 24/11 438/720 |
| 2005/0145832 A1* | 7/2005 | Wessling | | B32B 27/34 252/500 |
| 2006/0148233 A1* | 7/2006 | Datta | | H01L 23/49816 438/614 |
| 2006/0175686 A1* | 8/2006 | Murata | | H01L 21/0206 257/642 |
| 2007/0096071 A1* | 5/2007 | Kordus et al. | | 257/2 |
| 2007/0235708 A1* | 10/2007 | Elmegreen et al. | | 257/3 |
| 2008/0083611 A1* | 4/2008 | Felmetsger | | C23C 14/165 204/192.15 |
| 2008/0314618 A1* | 12/2008 | Shimoosako | | C08G 73/106 174/250 |
| 2009/0152655 A1* | 6/2009 | Laming | | B81C 1/00246 257/416 |
| 2009/0230379 A1* | 9/2009 | Klostermann et al. | | 257/5 |
| 2009/0242250 A1* | 10/2009 | Kohda | | B32B 15/08 174/259 |
| 2009/0291546 A1* | 11/2009 | Chen et al. | | 438/482 |
| 2010/0159645 A1* | 6/2010 | Yanagida | | H01L 21/56 438/113 |
| 2010/0187694 A1* | 7/2010 | Yu | | H01L 27/76898 257/751 |
| 2011/0012239 A1* | 1/2011 | Gu | | H01L 21/6836 257/637 |
| 2011/0133284 A1* | 6/2011 | Mitra | | B08B 7/0035 257/368 |
| 2011/0233766 A1* | 9/2011 | Lin | | H01L 21/76877 257/737 |
| 2012/0060915 A1* | 3/2012 | Chan | | H01L 31/0236 136/256 |
| 2012/0293420 A1* | 11/2012 | Stoumbos et al. | | 345/173 |
| 2013/0187120 A1* | 7/2013 | Redaelli et al. | | 257/5 |
| 2014/0266300 A1* | 9/2014 | Sherwin et al. | | 326/38 |
| 2014/0353571 A1* | 12/2014 | Liu | | 257/4 |

OTHER PUBLICATIONS

Bolton: "*Mobile Device RF Front-End TAM Analysis and Forecast*", CS MANTECH Conference, May 16-19, 2011, Palm Springs, CA, USA, pp. 1-4.

* cited by examiner

PHASE CHANGE MATERIAL SWITCH AND METHOD OF MAKING THE SAME

This invention was made with Government support under Contract No. NRO000-12-C-0114. The Government has certain rights in this invention.

TECHNICAL FIELD

The present invention relates to electronics, and more particularly to a phase change material switch and method of making the same.

BACKGROUND

Switching devices are implemented for a variety of reasons and in a variety of applications. For example, switching devices can be implemented for logic circuit and computing applications, for radio-frequency (RF) signal switching in front-end receiver systems, for RF transmitter systems, or a variety of other applications. Transistor technology has advanced considerably with respect to reduction of size and increase in efficiency. However, transistor switching devices exhibit signal losses from switching and interconnects. Furthermore, transistor switching devices still occupy a sizeable space on an integrated circuit (IC) or printed circuit board (PCB), and can still consume significant power in maintaining activation of the switches for a given switching state. Other switching devices can be implemented utilizing microelectromechanical systems (MEMS) processing. However, MEMS processing can be expensive and difficult, can require specialized packaging constraints, and can still exhibit switching losses and activation power consumption.

SUMMARY

In accordance with one example embodiment, a method is provided for making a switch. The method comprises forming an insulating layer over a substrate, forming a resistive heater element over the insulating layer, and depositing a thermally conductive electrically insulating barrier layer over the heating element. The method further comprises forming openings in the barrier layer aligned with ends of the resistive heater element, forming a phase change material (PCM) element over the barrier layer and positioned proximate to the resistive heater element, and forming conductive lines from ends of the PCM element and control lines from ends of the resistive heater element.

In accordance with another example embodiment, a method is provided for making a PCM switch. The method comprises forming an insulating layer over a substrate, forming a resistive heater element over the insulating layer, depositing a thermally conductive electrically insulating barrier layer over the heating element, and forming openings in the barrier layer aligned with ends of the resistive heater element. The method further comprises forming a patterned photoresist over the barrier layer with an opening overlying and aligned with the resistive heater device, sputtering PCM in its amorphous state to form a PCM element, and removing the patterned photoresist and excess PCM by applying a chemical solvent lift-off material. The method further comprises performing an anneal process to change the PCM element from its amorphous state to its crystalline state to enhance its immunity to deleterious effects caused by further processing, and forming conductive lines from ends of the PCM element and control lines from ends of the resistive heater element.

In another example embodiment, a PCM switch is provided that comprises a resistive heater element, and a PCM element proximate the resistive heater element. The PCM switch further comprises a thermally conductive electrically insulating barrier layer positioned between the PCM element and the resistive heater element, and conductive lines extending from ends of the PCM element and control lines extending from ends of the resistive heater element.

In yet another further example embodiment, a method is provided of making a PCM switch. The method comprises forming a resistive heater element, forming a PCM element proximate the resistive heater element, forming a thermally conductive electrically insulating barrier layer positioned between the PCM heating element and the resistive heating element, and forming conductive lines extending from ends of the PCM element and control lines extending from ends of the resistive heater element

DETAILED DESCRIPTION

The present disclosure provides for a phase change material (PCM) switch and a method of making the same. The PCM switch is a wideband, low loss, high isolation solid-state electrical switching device disposed monolithically on any wafer substrate material by embedding a variable-resistance thin-film element (strip or patch) of PCM within the gap of a conducting metal trace (e.g. a gap in the signal trace of a microstrip or coplanar transmission line), and placing an electrically isolated resistive heater element proximate the PCM to change its conductivity state. The switch can include two switch terminals, which contact a PCM element on two opposing sides and two control terminals, which make contact to the resistive heater element. The conductivity of the PCM can be changed by temperature cycling the material in a particular way, for example via ohmic (i.e., $I^2R$) heat. For example, heating the material to melting temperature (e.g., 800° C. for the case when the PCM is germanium telluride (GeTe)) and cooling rapidly results in an amorphous or insulating state, while heating the material to crystallization temperature (e.g., 200° C. for GeTe), holding at that temperature for a length of time sufficient to induce recrystallization and cooling at any rate results in the crystalline or conductive state.

The resistive heater element (e.g., thin-film resistor) is monolithically integrated with the PCM element to supply the required heating profile for phase transformation. Applying a high power pulse ( ) to the resistive heater element for some time (e.g. 1 ns-100 ms) causes the PCM element to take on the amorphous phase, thereby achieving the "off" state. Applying a second power pulse to the resistive heater element induces the recrystallization process which culminates in the crystallization of the PCM, thereby achieving the low resistivity "on" state. In the transformation from crystalline to amorphous, rapid cooling is achieved by keeping the heating pulse short in duration, which allows time for the heat to transfer from the resistive heater element to the PCM element but keeps the surrounding material cool. Heat from the melted PCM element escapes quickly allowing for rapid cooling, which limits the mobility of atoms within the PCM and facilitates the solidification in an amorphous state. The switch retains both states (crystalline and amorphous) in the absence of any current or voltage to the heater, making it non-volatile.

Figure 1:
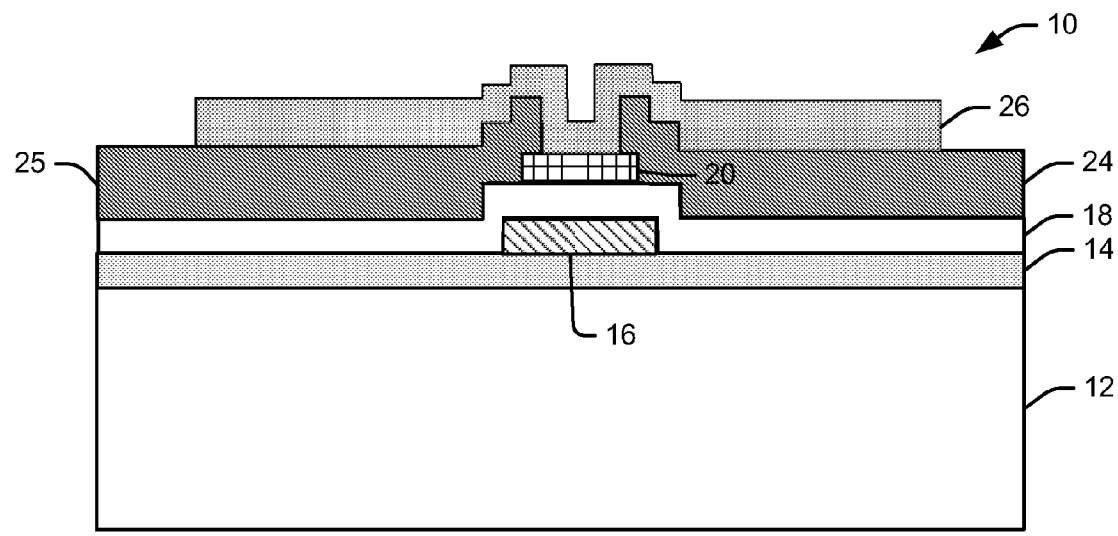
FIG. 1 is a schematic cross-sectional illustration of an example of a phase change material (PCM) switch structure.
Figure 2:
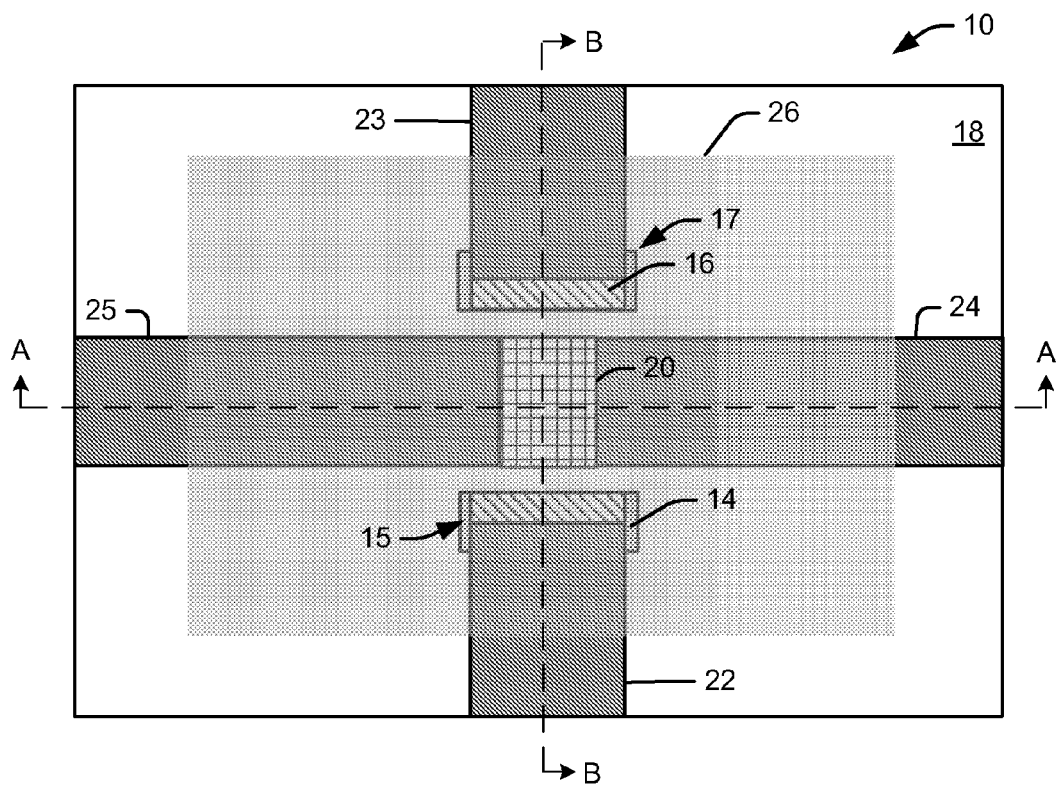
FIG. 2 is a plan view of the PCM switch structure of FIG. 1.

FIG. 1 is a schematic cross-sectional illustration of a PCM switch structure 10 along lines A-A of a plan view of the PCM switch structure 10, as illustrated in FIG. 2. The PCM switch structure 10 includes an insulating layer 14 overlying a substrate 12. The substrate 12 can be formed of a variety of mechanically supportive, insulating, semiconducting and/or conducting materials, such as, but not limited to, Silicon Carbide (SiC), Silicon (Si), Gallium Arsenide (GaAs), Sapphire ($Al_2O_3$), Alumina, Aluminum Nitride (AlN), Quartz ($SiO_2$), Germanium (Ge), Gallium Nitride (GaN), Indium Phosphide (InP), Silicon-on-Insulator (SOI), Silicon-on-Sapphire (SOS), and Silicon Germanium (SiGe). The PCM switch structure 10 could also be added directly to another device wafer with preexisting circuitry, including MMICs or ASICs. The insulating layer 14 electrically isolates a resistor heating element 16 from the substrate 12 and also determines the thermal resistance from the resistive heater element 16 to the substrate 12. The insulating layer 14 can be formed of Silicon Dioxide ($SiO_2$), Aluminum Nitride (AlN), Aluminum Oxide ($Al_2O_3$), Silicon Nitride (SiN) or a variety of other electrically insulating materials.

The resistive heater element 16 overlies the insulating layer 14 and a barrier layer 18 overlies the resistive heater element 16. A PCM element 20 overlies the barrier layer 18 and is positioned above the resistive heater element 16, such that heat from the resistive heater element 16 can pass through the barrier layer 18 to the PCM element 20. As shown in the plan view of FIG. 2, the barrier layer 18 includes a first opening 15 from which a first control line 22 is coupled to a first end of the resistive heater element 16 and a second opening 17 in which a second control line 23 is connected to a second end of the resistive heater element 16.

The resistive heater element 16 can include, for example, a metal or metal alloy material that exhibits resistivity and a substantially high thermal conductivity. For example, the resistive heater element 16 can be formed from nickel chromium silicon (NiCrSi), nickel chromium (NiCr), Tungsten (W), Titanium-Tungsten (TiW), Platinum (Pt), Tantalum (Ta), Molybdenum (Mo), Niobium (Nb), or Iridium (Ir), or any of a variety of or a combination of similar metal or metal alloys that have the above properties and have a melting temperature that is higher than the melting temperature of the PCM element 20.

The barrier layer 18 is an electrical insulator that is thermally conductive such that the barrier layer 18 electrically insulates the resistive heater element 16 from the PCM element 20, but allows heat from the resistive heater element 16 to pass through the barrier layer 18 to the PCM element 20 to change the state of the PCM element 20 between a crystallized state in response to a first heat profile and an amorphous state in response to a second heat profile. The barrier layer 18 can be formed of SiN, AlN, $SiO_2$, Silicon Carbide (SiC), diamond (C) or other barrier material having the properties discussed above.

The PCM element 20 can be formed from a variety of PCMs that exhibit variable electrical resistivity that is dependent on crystallinity. As an example, the PCM element 20 can be formed from a chalcogenide material, such as germanium telluride (GeTe), germanium antimony telluride (GeSbTe), germanium selenium telluride (GeSeTe), or any of a variety of similar materials. A first conductive line 24 extends from a first end of the PCM element 20 and a second conductive line 25 extends from a second end of the PCM element 20 to form an input and an output terminal for the PCM switch 10. The first and second conductive lines 24 and 25 form transmission lines to and from the PCM element 20, and the first and second control lines 22 and 23 form control lines to and from the resistive heater element 16. The PCM element 20 has been annealed to place the PCM element 20 in a crystallized state to mitigate deleterious effects on the PCM element 20 caused by various processing steps as will be subsequently discussed.

The first and second control lines 22-23 and the first and second conductive lines 24-25 can be formed from one or more metal layers. For example, the control lines 22-23 and conductive lines 24-25 can be formed from an ohmic contact that is in contact with the PCM element 20 and/or resistive heater element 16, a diffusion barrier and a contact material layer that is in contact with the barrier layer and be employed to provide conductive lines to other devices. A passivation layer 26 overlies a portion of the control lines 22-23, the conductive lines 24-25, the PCM element 20 and portions of the resistive heater element 16 to protect the active elements from the environment. The passivation layer 26 can be formed from SiN, AlN, $SiO_2$, $Al_2O_3$ or other electrically insulating materials.

Figure 3:
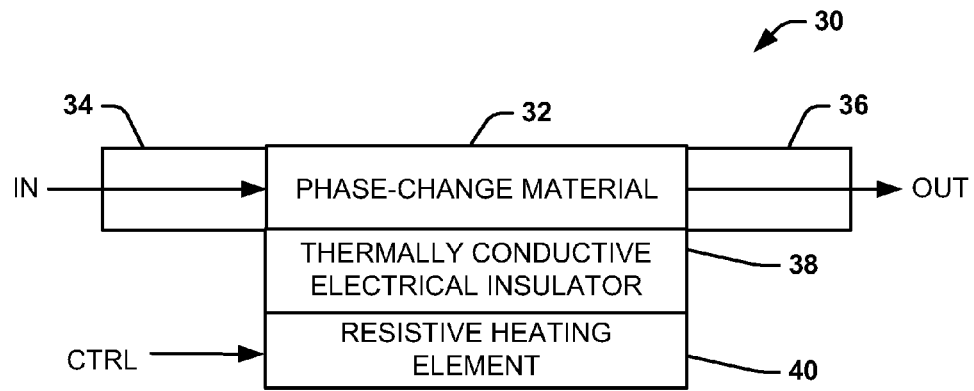
FIG. 3 is a functional block diagram of an example PCM switch.

FIG. 3 illustrates a functional block diagram of a PCM switch 30. The PCM switch 30 includes a PCM element 32 proximate a resistive heater element 40 and separated from the resistive heater element 40 by a thermally conductive electrical insulator 38 (i.e., barrier layer). The PCM switch 30 can be implemented in any of a variety of applications that require one or more switches that can be in the "on" or "off" state to pass or block a signal. Examples of such applications are described in commonly owned U.S. application Ser. No. 13/803,385, entitled, "Phase Change Material Reconfigurable Circuits", filed on Mar. 14. 2013, the same day as the present application, and which is incorporated herein by reference in its entirety. The PCM element 32 is disposed in-line with an input 34 and an output 36 of a transmission line. The input 34 receives an input signal IN, and the PCM element 32 can provide the input signal IN as an output signal OUT in a conducting state, such that the PCM element 32 acts substantially as a short-circuit, or can block the input signal IN from being provided as the output signal OUT in a blocking state, such that the PCM element 32 acts substantially as an open-circuit. As an example, the input signal IN can be provided as a radio frequency (RF) signal.

The resistive heater element 40 can be configured to receive a control signal CTRL to switch the PCM element 32 between the crystalline state and the amorphous state. The resistive heater element 40 can include, for example, a metal or metal alloy material that exhibits resistivity and a substantially high thermal conductivity. The control signal CTRL can be provided as, for example, a current pulse in one of two states to generate a heat profile from the resistive heater element 40 via ohmic (i.e., $I^2R$) heat. Thus, based on the proximal arrangement of the resistive heater element 40 with respect to the PCM element 32, the heat profile can be thermally transferred to the PCM element 32 to control the state of the PCM switch 30.

As an example, the control signal CTRL can have pulse characteristics (e.g., amplitude and duration) that can dictate the heat profile. For example, the control signal CTRL can be provided in a first state (e.g., with first pulse characteristics) that can generate a first heat profile from the resistive heater element 40, and can be provided in a second state (e.g., with second pulse characteristics) that can generate a second heat profile from the resistive heater element 40. The first heat profile can correspond to setting the PCM element 32 to the crystalline state, and thus setting the PCM switch 30 to the conducting state, and the second heat profile can correspond to setting the PCM element 32 to the amorphous state, and thus setting the PCM switch 30 to the blocking state.

Figure 4:
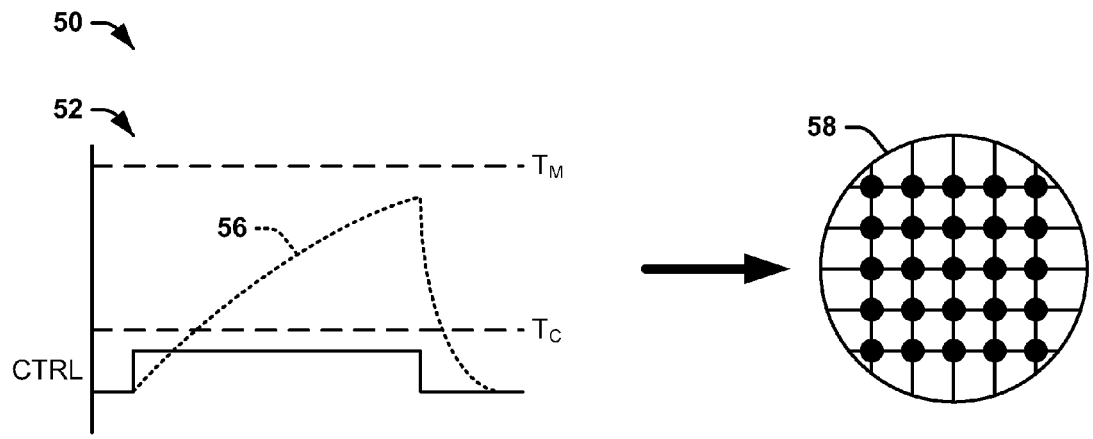
FIG. 4 is an example diagram of states of the PCM element of FIG. 3.
Figure 4:
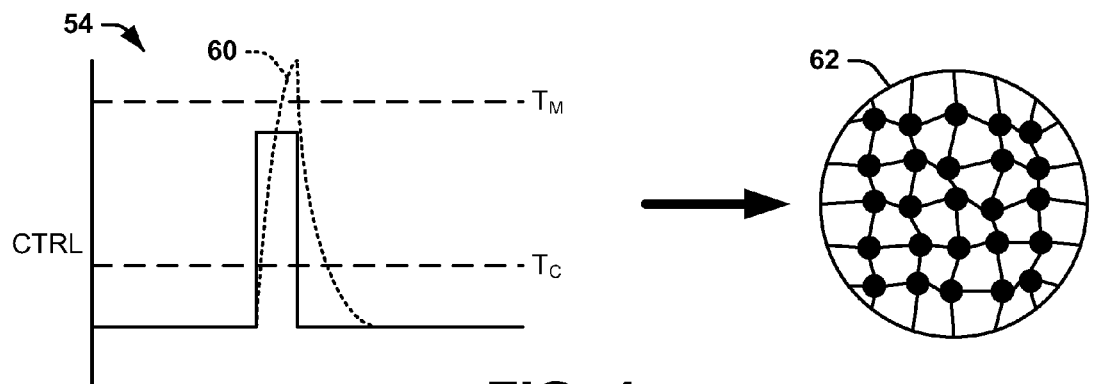

FIG. 4 illustrates an example diagram 50 of states of the PCM element 32 of FIG. 3. The diagram 50 includes a first state diagram 52 that demonstrates the control signal CTRL in a first state and a second state diagram 54 that demonstrates the control signal CTRL in a second state. In each of the first and second states, the control signal CTRL is demonstrated as a pulsed signal (e.g., current pulse) having separate pulse characteristics (e.g., amplitude and duration) relative to each other. In the example of FIG. 4, the first state of the control signal CTRL is demonstrated in the first state diagram 52 as having pulse characteristics of a substantially lower amplitude and a substantially longer pulse width relative to the control signal CTRL in the second state diagram 54, which has a substantially high amplitude and a substantially shorter pulse width. The pulse characteristics of the control signal CTRL in each of the first state diagram 52 and the second state diagram 54 can be selected to provide a desired heat profile sufficient to achieve one of crystallization and melting of the PCM, as described herein, while maintaining sufficiently rapid switching characteristics of the switch.

In response to the application of the control signal CTRL to the resistive heater element 40 in the first state, as demonstrated in the first state diagram 52, the resistive heater element 40 generates a first heat profile 56 that corresponds to a heat flux that is conducted to the PCM element 32 to induce a temperature T relative to a crystallization temperature $T_C$ and a melting temperature $T_M$. Thus, the first heat profile 56 provides that the heat conducted to the PCM element 32 results in a temperature T which is greater in amplitude than the crystallization temperature $T_C$, but less than the melting temperature $T_M$, and which remains greater than the crystallization temperature $T_C$ for a time sufficient to crystallize the PCM element 32. In the example of FIG. 4, the crystallization of the PCM element 32 is demonstrated at 58, which demonstrates the atoms of the PCM element 32 arranged in a substantially crystalline (i.e., crystal lattice) structure. Therefore, the PCM element 32 can be substantially conductive of electrical signals, such as the input signal IN shown in FIG. 3.

In response to the application of the control signal CTRL to the resistive heater element 40 in the second state, as demonstrated in the second state diagram 54, the resistive heater element 40 generates a second heat profile 60 that corresponds to a heat flux that is conducted to the PCM element 32 in the switch 30 resulting in a temperature relative to the crystallization temperature $T_C$ and the melting temperature $T_M$. Thus, the second heat profile 60 provides that the heat conducted to the PCM element 32 results in a temperature greater in amplitude than the melting temperature $T_M$, and leads to the transition of the PCM element 32 from solid to liquid state. Allowing the temperature to decay substantially rapidly after the falling-edge of the pulse of the control signal CTRL, such as based on characteristics of the thermally conductive electrical insulator 38 that separates the PCM element and the resistive heater element 40, results in solidification of PCM element 32 in the amorphous state.

In the example of FIG. 4, the melting and rapid solidification of the PCM element 32 is demonstrated at 62, which demonstrates the atoms of the PCM element 32 arranged in an amorphous structure. Therefore, the PCM element 32 can be substantially blocking of electrical signals, such as the input signal IN, in the example of FIG. 3.

It is to be understood that the characteristics of the thermally conductive electrical insulator, such as with respect to the type of the material and the thickness therein, can be selected to ensure a substantially rapid dissipation of the heat of the PCM element 32 to substantially mitigate the recrystallization of the PCM element 32 subsequent to melting during the amorphization process.

As demonstrated in the example of FIG. 4, the control signal CTRL is provided as a pulsed signal that implements a single pulse to switch PCM element 32 between the conducting state and the blocking state. Subsequent to the application of the control signal CTRL to the resistive heater element 40, the PCM element 32 remains in the one of the crystalline state and the amorphous state, such that the PCM switch 30 remains in the respective one of the conducting portion and the blocking portion after application of the control signal CTRL. As a result, the PCM switch 30 is held in one of the conducting state and the blocking state without application of any signal, and can thus operate with significantly less power than typical switches (e.g., transistor and MEMS switches). The PCM switch 30 can also exhibit sufficiently low losses with respect to the input signal IN (e.g., 0.5 dB or less). Furthermore, the PCM switch 30 can exhibit significant isolation of the input signal IN (e.g., approximately 50 dB).

Figure 5:
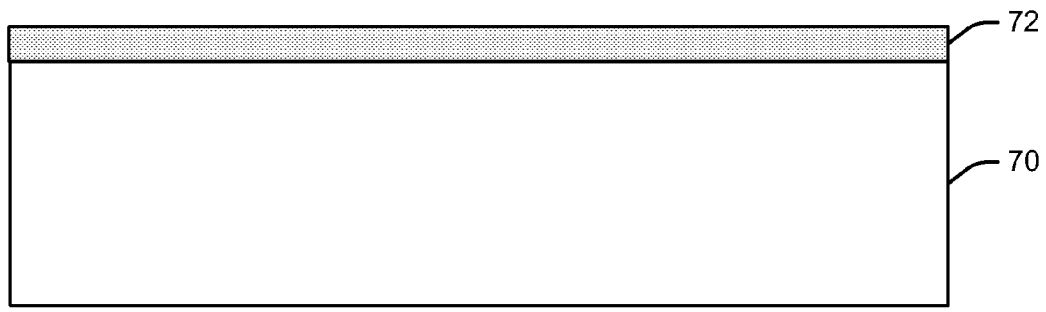
FIG. 5 is a schematic cross-sectional illustration of an example PCM switch structure in its early stages of fabrication.

Turning now to FIGS. 5-22, process blocks in connection with fabrication of a PCM switch are described. FIG. 5 illustrates a cross-sectional view of PCM switch structure in its early stages of fabrication. The PCM switch structure includes a substrate 70 that provides mechanical support for materials forming a PCM switch. The substrate 70 can be formed of mechanically supportive, insulating, semiconducting and/or conducting materials, such as, but not limited to, Silicon Carbide (SiC), Silicon (Si), and/or Gallium Arsenide (GaAs), ($Al_2O_3$), Alumina, Quartz ($SiO_2$), Germanium (Ge), Gallium Nitride (GaN), Indium Phosphide (InP), Silicon-on-Insulator (SOI), Silicon-on-Sapphire (SOS), and/or Silicon Germanium (SiGe). The PCM switch could also be added directly to another device wafer with preexisting circuitry such as MMICs or ASICs.

An insulating layer 72 is deposited over the substrate. Any suitable technique for depositing the insulating layer 72 can be employed such as deposited via Plasma Enhanced Chemical Vapor Deposition (PECVD) and/or growing the insulating layer by oxidizing the substrate 70 at high temperature. The insulating layer 72 can have a thickness in the range of about 10 nm to about 1 um to electrically isolate a subsequently formed resistive heater element from the substrate 70. The insulating layer 72 can be formed of $SiO_2$, $Al_2O_3$, AlN, SiN or a variety of other insulating layer materials.

Figure 6:
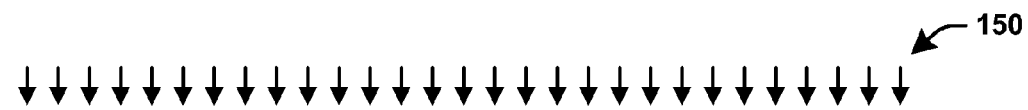
FIG. 6 is a schematic cross-sectional illustration of the structure of FIG. 5 undergoing a resistive heater material deposition.
Figure 6:
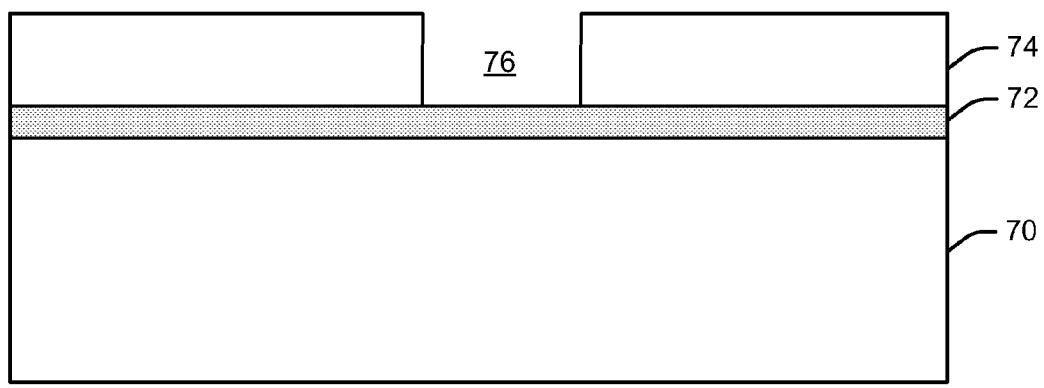
Figure 7:
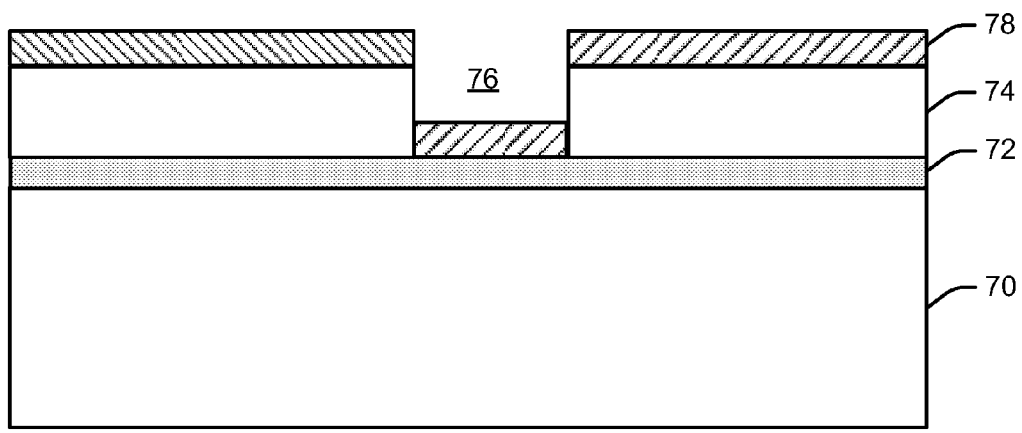
FIG. 7 is a schematic cross-sectional illustration of the structure of FIG. 6 after undergoing the resistive heater material deposition.

Next, as represented in FIG. 6, a photoresist material layer 74 is applied to cover the structure and is then patterned and developed to expose open region 76 in the photoresist material layer 74 in accordance with a desired pattern. The photoresist material layer 74 can have a thickness that varies in correspondence with the wavelength of radiation used to pattern the photoresist material layer 74. The photoresist material layer 74 may be formed over the insulating layer 72 via spin-coating or spin casting deposition techniques, selectively irradiated and developed to form the opening 76.

Figure 8:
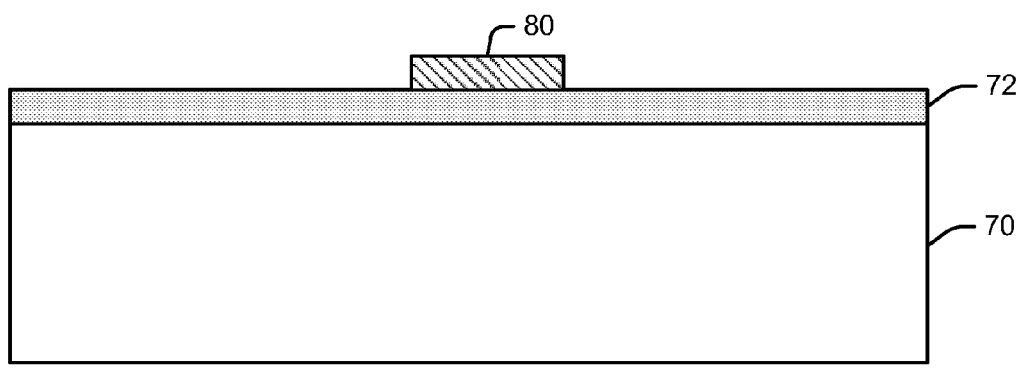
FIG. 8 is a schematic cross-sectional illustration of the structure of FIG. 9 after undergoing a photoresist material lift off process.

A resistive heater material deposition process 150 is performed on the structure of FIG. 6 to form a resistive heater element 80 (FIG. 8). The resistive heater material deposition process 150 also results in a resistive heater material layer 78 overlying the photoresist material layer 74, as illustrated in the resultant structure of FIG. 7. The resistive heater material deposition process 150 can be performed by sputtering resistive heater materials into the opening of the patterned photoresist material layer. Other standard known photolithography and deposition techniques could be employed to form the resistive heater element.

The resistive heater materials can include, for example, a metal or metal alloy material that exhibits resistivity and a substantially high thermal conductivity. For example, the resistive heater materials can be nickel chromium silicon (NiCrSi), Nickel Chromium (NiCr), Tungsten (W), Titanium-Tungsten (TiW), Platinum (Pt), Tantalum (Ta), Molybdenum (Mo), Niobium (Nb), or Iridium (Ir), or any of a variety of or a combination of similar metal or metal alloys that have the above properties and have a melting temperature that is higher than the melting temperature of the PCM of the PCM switch.

Figure 9:
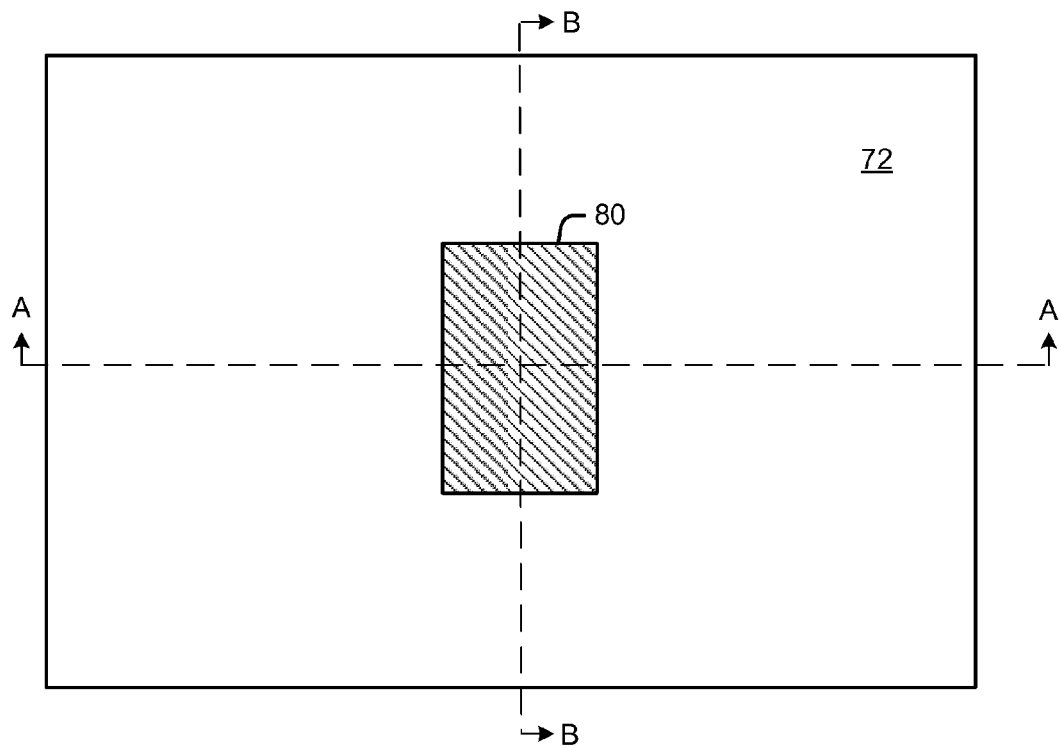
FIG. 9 is a plan view of the resultant structure of FIG. 8.

The photoresist material layer 74 is then lifted off employing a chemical solvent lift off material to remove the photoresist material layer 74 and the excess resistive heater material layer 78 overlying the photoresist material layer 74 to leave the resistive heater element 80, as illustrated in the resultant cross-sectional structure along lines A-A of FIG. 8 of FIG. 9. FIG. 9 illustrates a plan view of the resultant structure show in FIG. 8.

Figure 10:
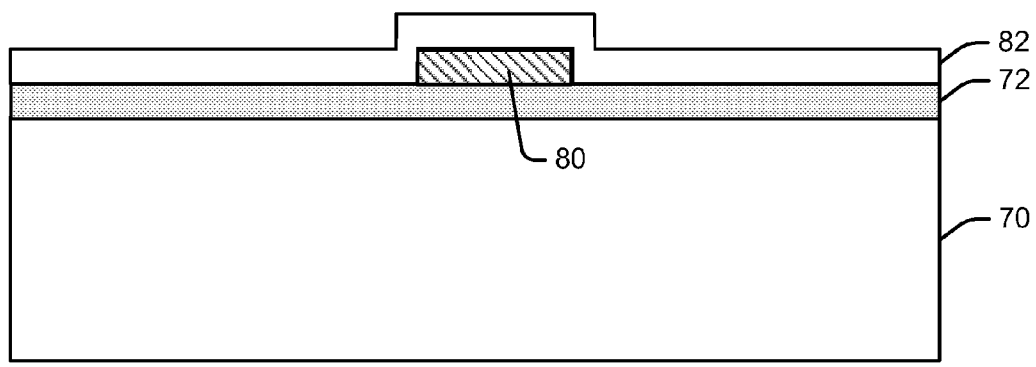
FIG. 10 is a schematic cross-sectional illustration of the structure of FIGS. 8-9 after undergoing a barrier layer deposition.

Next, a barrier layer 82 is deposited over the structure illustrated in FIGS. 8-9 to provide the resultant structure shown in the cross-sectional view along lines A-A in FIG. 10. Any suitable technique for forming the barrier layer 82 may be employed such as Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDPCVD) techniques or spin on techniques to a thickness in the range of about 1 nm to about 500 nm. The barrier layer 82 is an electrical insulator that is thermally conductive, such that the barrier layer 82 electrical insulates, but allows heat to pass through the barrier layer 82. The barrier layer 82 can be formed of SiN, AlN, $SiO_2$, SiC or other barrier material having the properties discussed above.

Figure 11:
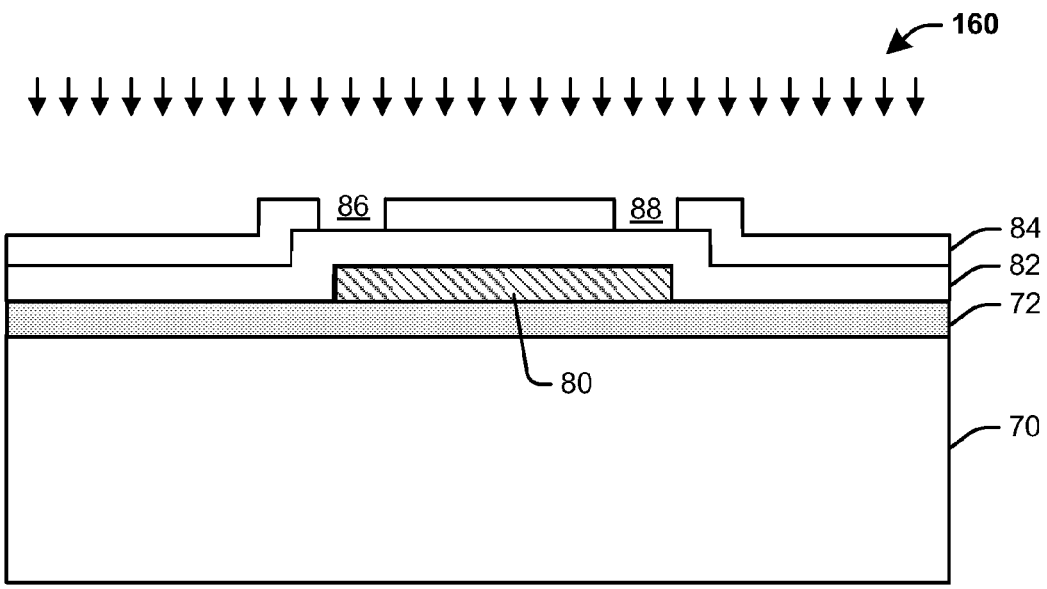
FIG. 11 is a schematic cross-sectional illustration of the structure of FIG. 10 along the lines B-B undergoing an etch to form openings in the barrier layer.
Figure 12:
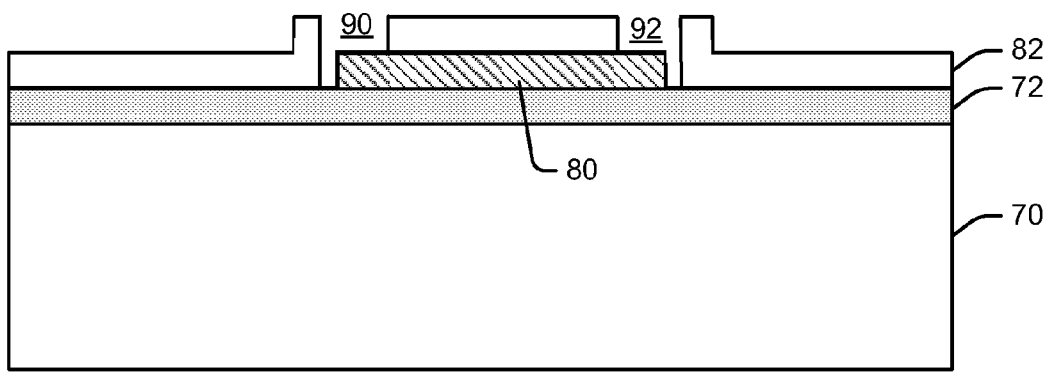
FIG. 12 is a schematic cross-sectional illustration of the structure of FIG. 11 after stripping of the photoresist material layer.

FIG. 11 is a cross-sectional view of the structure of FIG. 10 along the lines B-B during the formation of openings in the barrier layer 82 to provide access for control lines to ends of the resistive heater element 80. As shown in FIG. 11, a photoresist material layer 84 is applied to cover the structure and is then patterned and developed to expose open regions 86 and 88 in the photoresist material layer 84 in accordance with a desired pattern. The photoresist material layer 84 can have a thickness that varies in correspondence with the wavelength of radiation used to pattern the photoresist material layer 84. The photoresist material layer 84 may be formed over the barrier layer 82 via spin-coating or spin casting deposition techniques, selectively irradiated and developed to form the openings 86 and 88.

Figure 13:
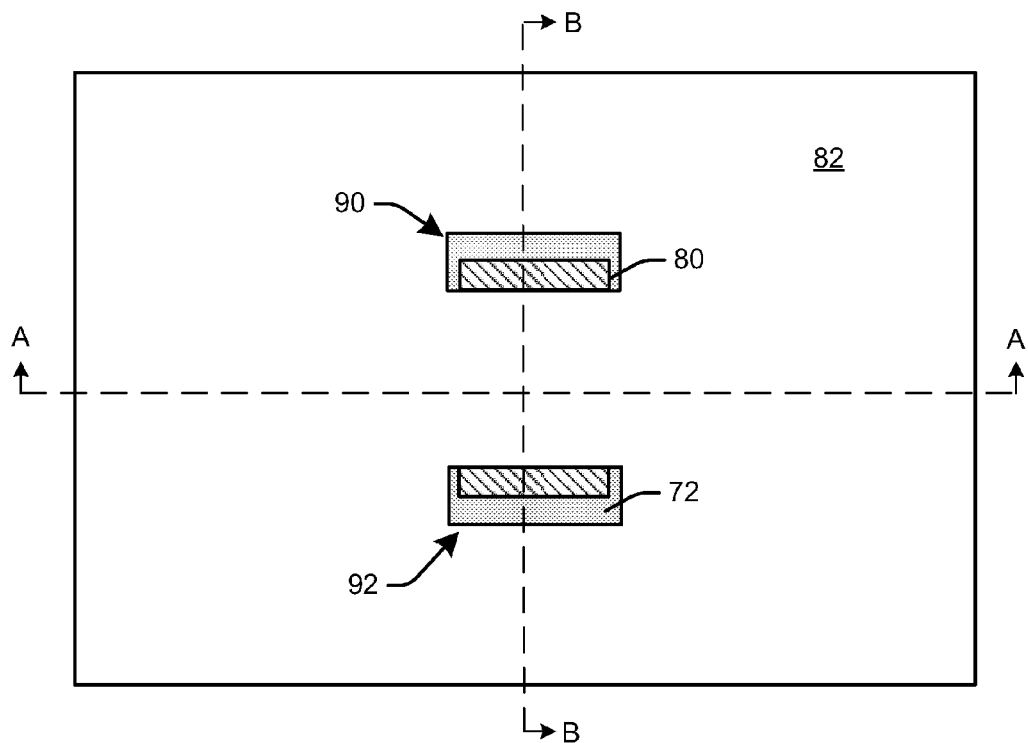
FIG. 13 illustrates a plan view of the resultant structure of FIG. 12.

FIG. 11 also illustrates performing of an etch 160 (e.g., anisotropic reactive ion etching (RIE)) on the barrier layer 82 to form extended openings 90 and 92 (FIG. 12) in the barrier layer 82 based on the via pattern in the photoresist material layer 84. The etch step 160 can be a dry etch that employs an etchant which selectively etches the barrier layer 82 at a faster rate than the underlying layers and the overlying photoresist material layer 84. For example, the barrier layer 82 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 84 to thereby create the extended openings 90 and 92. The photoresist material layer 84 is then stripped to provide the resultant structure of FIG. 12 with extended openings 90 and 92 to provide contact access to ends of the resistive heater device 80. FIG. 13 illustrates the plan view of the resultant structure of FIG. 12.

Figure 14:
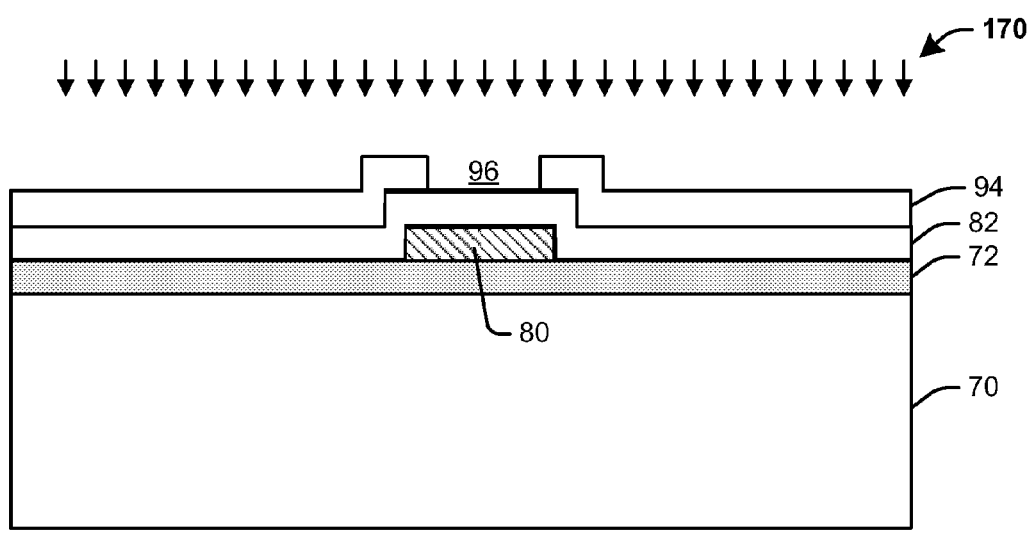
FIG. 14 is a schematic cross-sectional illustration of the structure of FIGS. 12 and 13 undergoing a PCM deposition.

Next, referring to the cross-sectional view along lines A-A in FIG. 14, a photoresist material layer 94 is applied to cover the structure and is then patterned and developed to expose open region 96 in the photoresist material layer 94 in accordance with a desired pattern. The photoresist material layer 94 can have a thickness that varies in correspondence with the wavelength of radiation used to pattern the photoresist material layer 94. The photoresist material layer 94 may be formed over the barrier layer 82 via spin-coating or spin casting deposition techniques, selectively irradiated and developed to form the opening 96.

Figure 16:
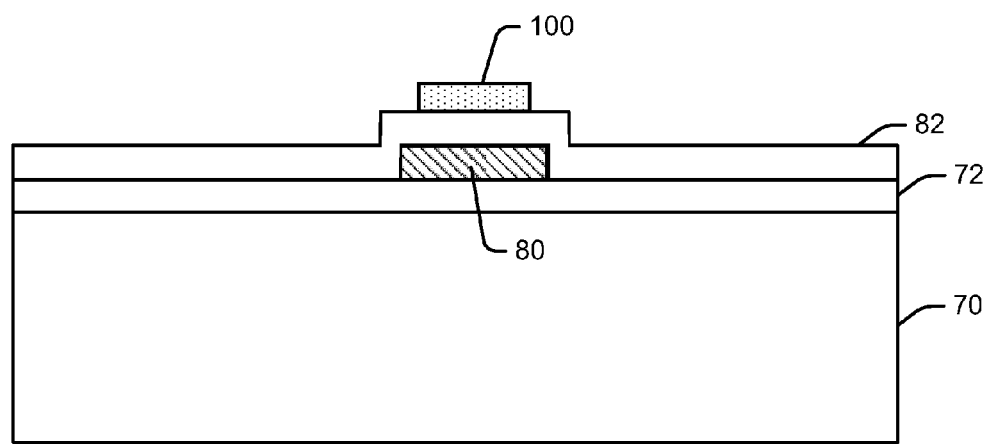
FIG. 16 is a schematic cross-sectional illustration of the structure of FIG. 15 after undergoing a photoresist material lift off process.

A PCM deposition process 170 is performed on the structure of FIG. 14 to deposit PCM in the amorphous state to form a PCM element 100 (see FIG. 16). Alternatively, the PCM deposition process 170 can be a heated deposition such that the PCM is deposited as a film polycrystalline or crystalline. The thickness of the deposited PCM can be from about 1 nm to about 5 um. The PCM element 100 can be formed from a variety of PCMs that exhibit variable electrical resistivity that is dependent on crystallinity. As an example, the PCM element 100 can be formed from a chalcogenide material, such as germanium telluride (GeTe), germanium antimony telluride (GeSbTe), germanium selenium telluride (GeSeTe), or any of a variety of similar materials. The PCM can be deposited employing a variety of deposition techniques, such as Physical Vapor Deposition (PVD) (e.g., metal evaporation, sputtering), Chemical Vapor Deposition (CVD), and/or Atomic Layer Deposition (ALD).

The PCM crystalline resistivity was found to be very sensitive to sputtering parameters. Therefore, the sputtering deposition can be performed at sputter condition powers ranging from about 0.1 to 5.0 W/cm$^2$ and pressures ranging from about 1.0 mTorr to about 50.0 mTorr.

Figure 15:
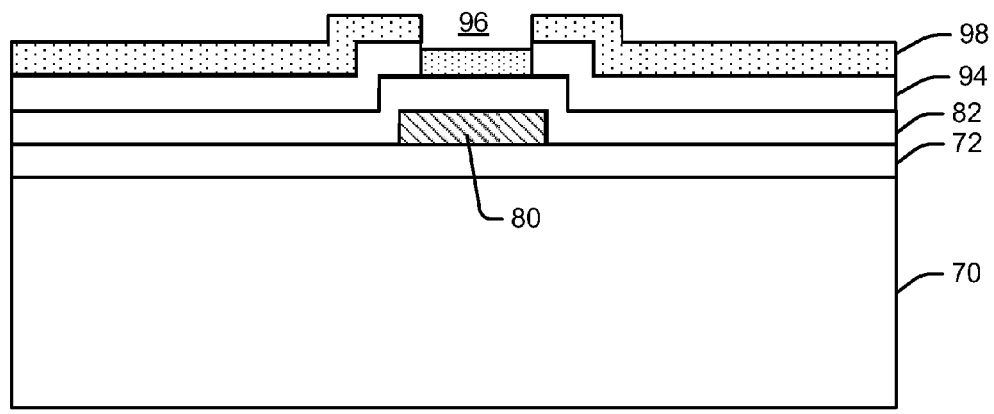
FIG. 15 is a schematic cross-sectional illustration of the structure of FIG. 14 after undergoing the PCM deposition.

The PCM deposition process 170 also results in a PCM layer 98 overlying the photoresist material layer 94, as illustrated in the resultant structure of FIG. 15. The photoresist material layer 94, and PMC layer 98 can be removed by applying a chemical solvent lift-off material to provide the resultant structure of FIG. 16. It has also been determined that the PCM is very sensitive to chemical solvent lift-off materials. Therefore, the following chemical solvent lift-off materials were found to mitigate damage to the PCM element: acetone, isopropyl alcohol, and/or N-methylpyrrolidone (100% pure, added surfactants tend to destroy the PCM).

Figure 17:
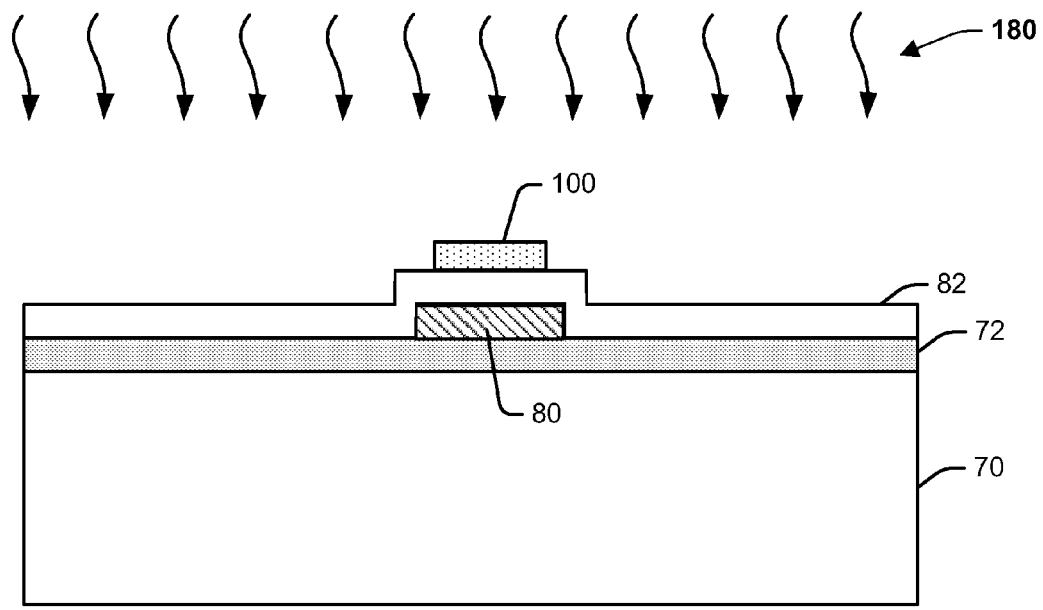
FIG. 17 is a schematic cross-sectional illustration of the structure of FIG. 16 undergoing an anneal process.
Figure 18:
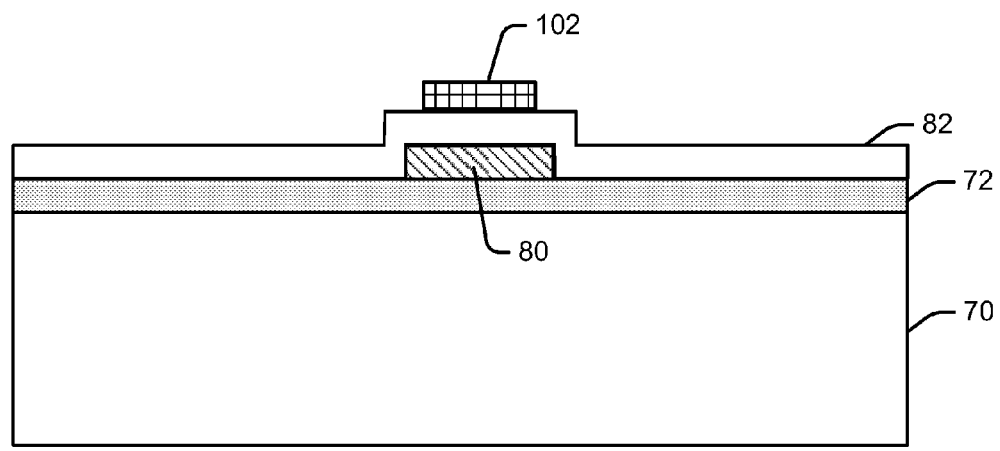
FIG. 18 is a schematic cross-sectional illustration of the structure of FIG. 17 after undergoing the anneal process.
Figure 19:
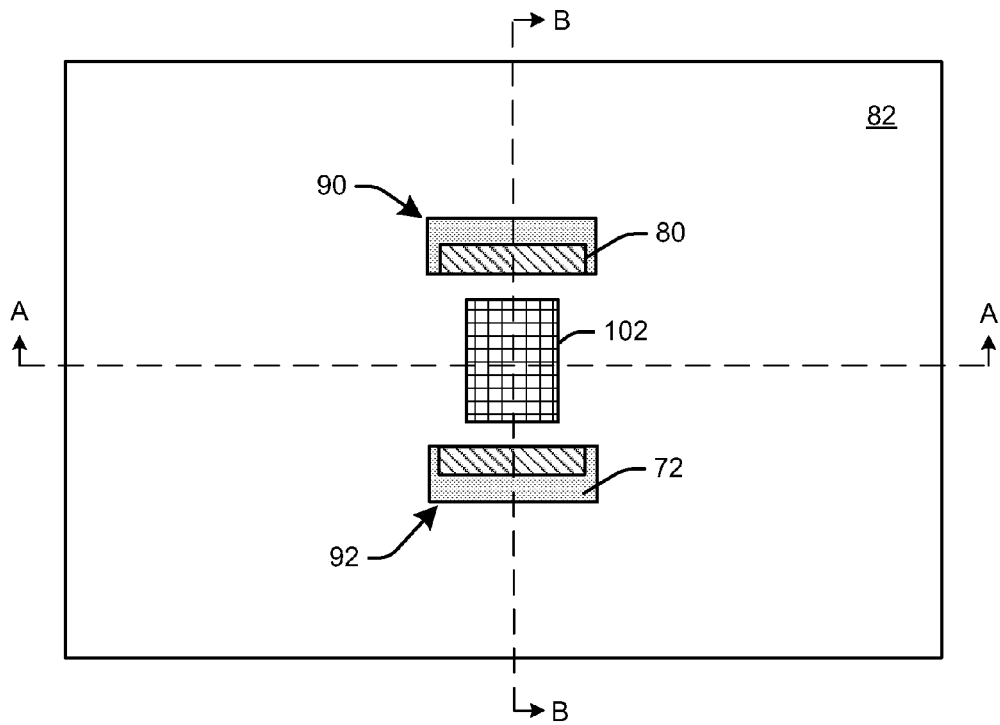
FIG. 19 is a plan view of the resultant structure of FIG. 18.

In order to lower the crystalline on-state resistivity and improve the PCM resistance to further processing chemicals, an anneal process 180 is performed as shown in FIG. 17 to crystallize the PCM element 102. The structure of FIG. 17, is annealed at a pressure between $1 \times 10^{-8}$ Torr to 1000 Torr and a temperature between 100° C. to about 900° C. for about 30 seconds to 24 hours, such that the PCM element 100 remains above crystallization temperature during the anneal. Oxygen content less than 20% must be maintained during the anneal. The resultant structure is illustrated in FIG. 18, such that a modified PCM element 102 results that has changed from the amorphous state to the crystalline state. It has been determined that the PCM element 102 in the crystalline state is more immune to subsequent processing than the PCM element 100 in the amorphous state. A plan view of the resultant structure is shown in FIG. 19. The anneal process 180 can be skipped if the PCM is deposited in a polycrystalline or crystalline state.

Figure 20:
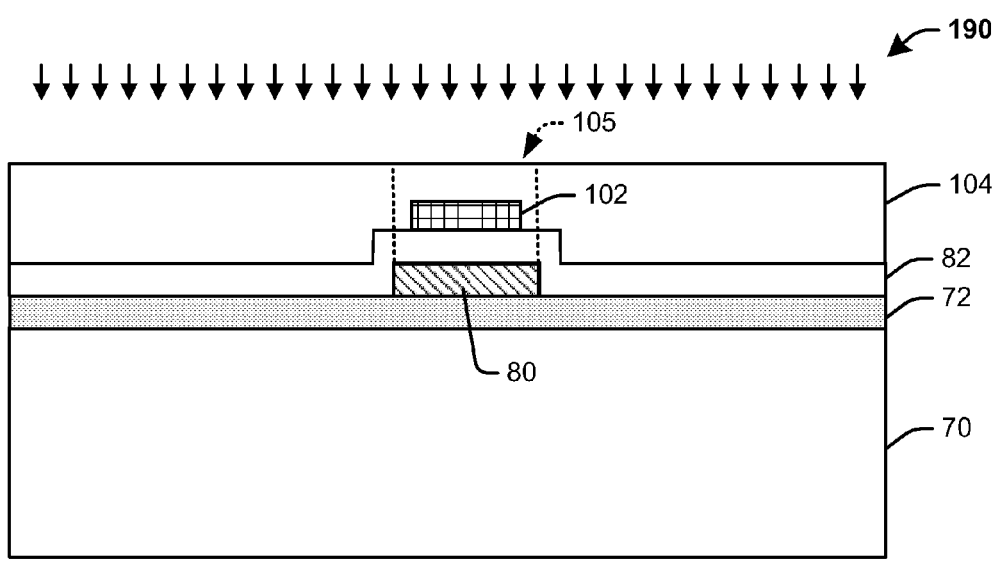
FIG. 20 is a schematic cross-sectional illustration of the structure of FIGS. 17 and 18 after undergoing conductive material deposition.

Next, referring to the cross-sectional view along lines A-A in FIG. 20, a photoresist material layer 104 is applied to cover the structure and is then patterned and developed to expose trenches in the photoresist material layer 104 in accordance with a desired pattern. The trenches are formed for depositing conductive material for forming conductive lines 106 and 108 to the PCM strip 102 and control lines 110 and 112 to the resistive heater element 80 (see FIGS. 21-22). The conductive line trenches and one of the control line trenches is not shown in FIG. 20, since it has been cut away in illustration of the cross-sectional view. The dashed lines illustrate one trench 105 for forming one of the control lines to the resistive heating device 80 resides behind the PCM element 102. The photoresist material layer 104 can have a thickness that varies in correspondence with the wavelength of radiation used to pattern the photoresist material layer 104. The photoresist material layer 104 may be formed over the barrier layer 82 via spin-coating or spin casting deposition techniques, selectively irradiated and developed to form the trenches 105.

Figure 21:
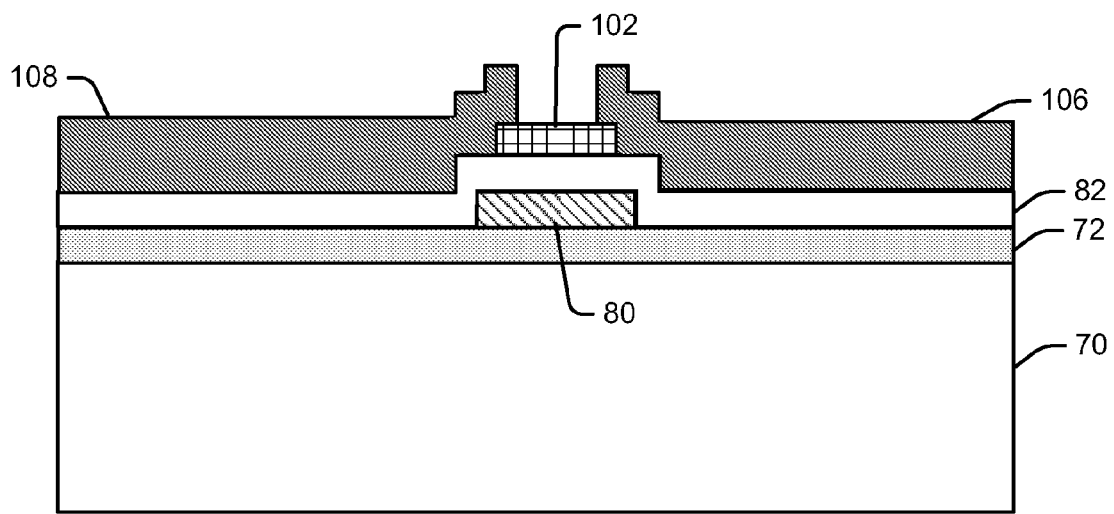
FIG. 21 is a schematic cross-sectional illustration of the structure of FIG. 20 after undergoing a photoresist material lift off process.
Figure 22:
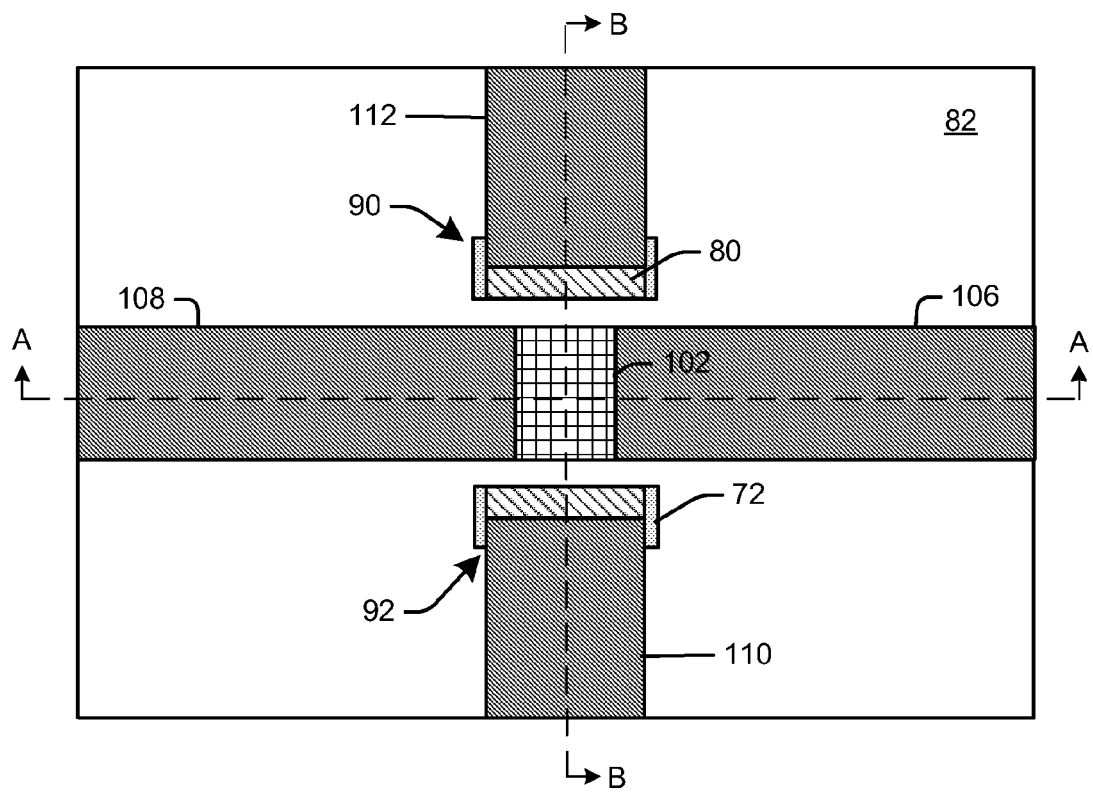
FIG. 22 is a plan view of the resultant structure of FIG. 21.

A contact material deposition process 190 is performed on the structure of FIG. 20 to form conductive lines 106 and 108 to the PCM element 102 and control lines 110 and 112 to the resistive heater element 80. After the photoresist material is stripped, the resultant structure is illustrated in FIG. 21. A plan view of the resultant structure is illustrated in FIG. 22. The contact material deposition process 190 could be a contact material evaporation process, such that one or more conductive materials are deposited to form conductive lines 106 and 108 and control lines 110 and 112. A precleaning procedure can be performed on ends of the resistive heater element 80 and the PCM element 102 that relies on the hardened PCM element 102 produced by the anneal process 180 shown in FIG. 17. In one example, an ohmic contact metal is deposited on the ends of the PCM element 102 and the ends of the resistive heater element 80. Conductive lines having a thickness of about 10 nm to about 5 um are deposited in contact with the ohmic contact metal to form conductive lines 106 and 108 and control lines 110 and 112. Examples of ohmic contact metals include but are not limited to tungsten (W), aluminum (Al), chromium (Cr), titanium (Ti) and Platinum (Pt). Examples of materials used for conductive lines include but are not limited to gold (Au), copper (Cu) and aluminum (Al).

A passivation layer (shown as 26 in FIGS. 1-2) is then deposited over the structure shown in FIGS. 21-22 to protect the active elements from the environment to provide the resultant structure illustrated in FIGS. 1-2. The passivation layer can be formed from SiN, AlN, $SiO_2$, $Al_2O_3$ or other relevant materials. The passivation layer can be deposited employing PECVD to a thickness of about 1 nm to about 5 um. Subsequent processing can be performed to expose ends of conductive lines 106 and 108 and control lines 110 and 112 where probes or wire bonds need to contact the switch terminals and control terminals.

It is to be appreciated that although the examples illustrated in FIGS. 1-2 and 5-24 show a PCM switch structure that includes a single PCM element proximate and overlying a single resistive heater element, the present invention is not limited to this embodiment. For example, a single resistive heating element can disposed below, offset and spaced apart from the PCM element, or a single resistive heater element can be disposed above and spaced apart from the PCM element or disposed above, offset and spaced apart from the PCM element. Additionally, a first resistive heater element can be disposed above and spaced apart from the PCM element and a second resistive heater element can be disposed below and spaced apart from the PCM element, such that the first and second resistive heater elements can be conductively coupled together. Furthermore, a resistive heater element can be formed of three (e.g., u-shaped) or four sides (e.g., box shaped) to partially or substantially surround the PCM element.

Figure 23:
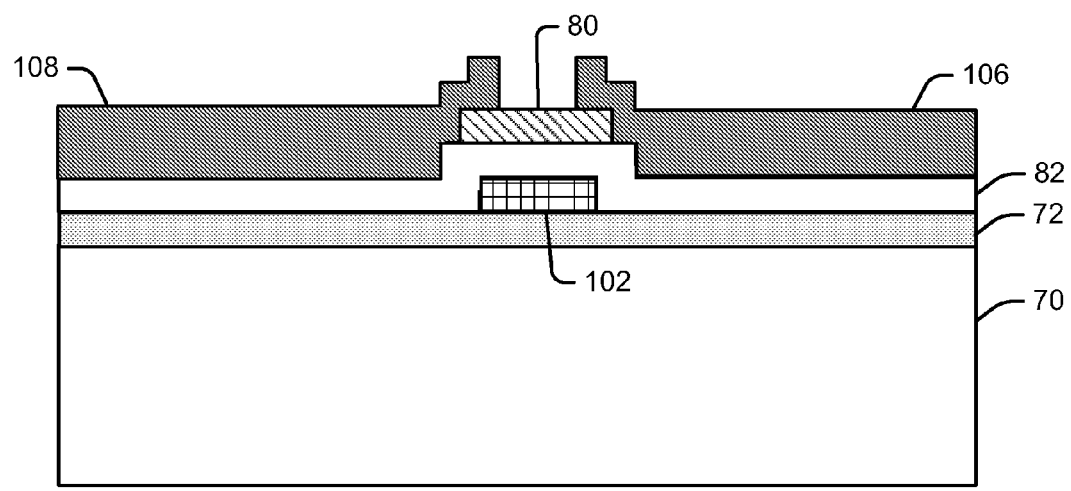
FIG. 23 is a schematic cross-sectional illustration of an example of a PCM switch structure with the resistive heater element overlying the PCM element.
Figure 24:
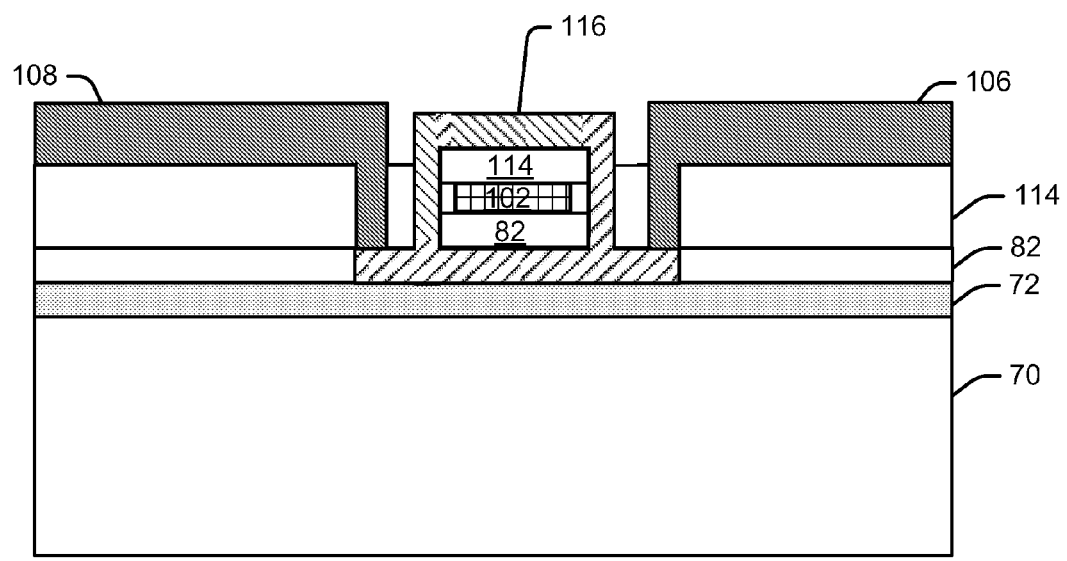
FIG. 24 is a schematic cross-sectional illustration of an example of a PCM switch structure having a resistive heating element that has four sides that substantially surrounds the PCM element.

FIG. 23 is a schematic cross-sectional illustration of an example of a PCM switch structure with the resistive heater element 80 overlying the PCM element 102. Similar processes as described above can be performed to form the PCM element 102 and the resistive heater 80. Openings can be formed in the barrier layer 82 to make contacts with ends of the PCM element 102 as was previously performed to make contacts with ends of the resistive heater element 80. FIG. 24 is a schematic cross-sectional illustration of an example of a PCM switch structure having a resistive heating element 116 that has four sides that substantially surrounds the PCM element. Similar processes as described above can be performed to form the four sided heater element by depositing barrier layers and etching as is know in the art of semiconductor processing. Furthermore, similar processing steps can be performed to provide conductive lines and control lines to the ends of PCM element 102 and the ends of the resistive heater device 80.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations.

What is claimed is:

1. A method for making a switch, the method comprising:
   forming an insulating layer over a substrate;
   forming a resistive heater element over the insulating layer;
   depositing a thermally conductive electrically insulating barrier layer over the heating element;
   forming openings in the barrier layer aligned with ends of the resistive heater element;
   forming a phase change material (PCM) element over the barrier layer spaced apart and proximate to the resistive heater element comprising:
      forming a patterned photoresist over the barrier layer with an opening overlying and aligned with the resistive heater element;
      depositing PCM to form the PCM element; and
      removing the patterned photoresist and excess PCM by applying a chemical solvent lift-off material; and
   forming conductive lines from ends of the PCM element and control lines from ends of the resistive heater element.

2. The method of claim 1, wherein the PCM element being formed in its amorphous state, and further comprising performing an anneal process to change the PCM element from its amorphous state to its crystalline state.

3. The method of claim 2, wherein the performing of an anneal at a pressure between about $1\times10^{-8}$ Torr to 1000 Torr and a temperature between about 100° C. to about 900° C. for about 30 seconds to about 24 hours, such that the PCM element remains above the crystallization temperature during the anneal with oxygen content less than 20% maintained during the anneal.

4. The method of claim of 1, wherein the chemical solvent lift-off material is acetone, isopropyl alcohol, and/or 100% pure N-methyl pyrrolidone.

5. The method of claim of 1, wherein the depositing PCM comprises sputtering PCM at sputter condition powers ranging from about 0.1 to 5.0 W/cm² and pressures ranging from about 1.0 mTorr to about 50.0 mTorr to provide optimized crystalline resistivity.

6. The method of claim 1, wherein the forming conductive lines from ends of the PCM element and control lines from ends of the resistive heater element comprises:
   forming a patterned photoresist over the barrier layer and the PCM element with trenches extending from both ends of the PCM and trenches extending from both openings in the barrier layer aligned with ends of the resistive heater element;
   depositing a conductive material to form conductive lines extending from each end of the PCM element and control lines extending from each end of the resistive heater element; and
   removing the patterned photoresist and excess conductive material by applying a chemical solvent lift-off material.

7. The method of claim 6, wherein the chemical solvent lift-off material is acetone, isopropyl alcohol, and/or 100% pure N-methyl pyrrolidone.

8. The method of claim 1, further comprising forming a passivation layer over a portion of the control lines, the conductive lines, the PCM element and portions of the resistive heater element to protect the active elements from the environment.

9. The method of claim 1, wherein the resistive heater element is formed from a material comprising one of nickel chromium silicon (NiCrSi), nickel chromium (NiCr), Tungsten (W), Titanium-Tungsten (TiW), Platinum (Pt), Tantalum (Ta), Molybdenum (Mo), Niobium (Nb), and Iridium (Ir); the barrier layer is formed from a material comprising one of Silicon Nitride (SiN), Aluminum Nitride (AlN), Silicon Dioxide ($SiO_2$), Silicon Carbide (SiC); and the PCM element is formed from a material that is one of germanium telluride (GeTe), germanium antimony telluride (GeSbTe), and germanium selenium telluride (GeSeTe).

10. A method for making a phase change material (PCM) switch, the method comprising:
    forming an insulating layer over a substrate;
    forming a resistive heater element over the insulating layer;
    depositing a thermally conductive electrical insulating barrier layer over the resistive heating element;
    forming openings in the barrier layer aligned with ends of the resistive heater element;
    forming a patterned photoresist over the barrier layer with an opening overlying and aligned with the resistive heater device;
    sputtering PCM in its amorphous state to form a PCM element;
    removing the patterned photoresist and excess PCM by applying a chemical solvent lift-off material;
    performing an anneal process to change the PCM element from its amorphous state to its crystalline state to enhance its immunity to deleterious effects caused by further processing; and
    forming conductive lines from ends of the PCM element and control lines from ends of the resistive heater element.

11. The method of claim 10, wherein the performing of an anneal at a pressure between about $1\times10^{-8}$ Torr to about 1000 Torr and a temperature between about 100° C. to about 900° C. for about 30 seconds to about 24 hours, such that the PCM element remains above the crystallization temperature during the anneal with oxygen content less than 20% maintained during the anneal.

12. The method of claim of 10, wherein the chemical solvent lift-off material is acetone, isopropyl alcohol, and/or 100% pure N-methyl pyrrolidone.

13. The method of claim of 10, wherein the sputtering PCM comprises sputtering PCM at sputter condition powers ranging from about 0.1 to 5.0 W/cm² and pressures ranging from about 1.0 mTorr to about 50.0 mTorr to provide optimized crystalline resistivity.

14. The method of claim 10, further comprising performing a cleaning on ends of the PCM element and resistive heater element prior to forming conductive lines from ends of the PCM element and control lines from ends of the resistive heater element.

15. The method of claim 14, wherein the forming conductive lines from ends of the PCM element and control lines from ends of the resistive heater element comprises:

forming a patterned photoresist over the barrier layer and the PCM element with trenches extending from both ends of the PCM and trenches extending from both openings in the barrier layer aligned with ends of the resistive heater element comprises:
depositing an ohmic contact on each end of the PCM element and the resistive heater element;
depositing a diffusion barrier on each ohmic contact;
depositing contact material into the trenches and in contact with the diffusion barriers to form the conductive lines and the control lines; and
removing the patterned photoresist and excess conductive material by applying a chemical solvent lift-off material.

16. The method of claim 15, further comprising forming a passivation layer over a portion of the control lines, the conductive lines, the PCM element and portions of the resistive heater element to protect the active elements from the environment.

17. The method of claim 10, wherein the resistive heater element is formed from a material comprising one of nickel chromium silicon (NiCrSi), nickel chromium (NiCr), Tungsten (W), Titanium-Tungsten (TiW), Platinum (Pt), Tantalum (Ta), Molybdenum (Mo), Niobium (Nb), and Iridium (Ir); the barrier layer is formed from a material comprising one of Silicon Nitride (SiN), Aluminum Nitride (AlN), Silicon Dioxide ($SiO_2$), Silicon Carbide (SiC); and the PCM element is formed from a material that is one of germanium telluride (GeTe), germanium antimony telluride (GeSbTe), and germanium selenium telluride (GeSeTe).

18. A method of making a phase change material (PCM) switch, the method comprising:
forming a resistive heater element;
forming a PCM element proximate the resistive heater element;
forming a thermally conductive electrical insulating barrier layer positioned between the PCM element and the resistive heating element; and
forming conductive lines extending from ends of the PCM element and control lines extending from ends of the resistive heater element comprising:
forming a patterned photoresist over the barrier layer and the PCM element with trenches extending from both ends of the PCM and trenches extending from both openings in the barrier layer aligned with ends of the resistive heater element;
depositing a conductive material to form conductive lines extending from each end of the PCM element and control lines extending from each end of the resistive heater element; and
removing the patterned photoresist and excess conductive material by applying a chemical solvent lift-off material.

19. The method of claim 18, wherein the PCM element is formed over the resistive heating element.

20. The method of claim 18, wherein the resistive heating element is formed over the PCM element.

21. The method of claim 18, wherein the resistive heating element comprises a first resistive heating element and a second resistive heating element, the PCM element being formed over the first resistive heating element and the second resistive heating element being formed over the PCM element.

22. The method of claim 18, wherein the forming the resistive heating element comprises forming four sides of resistive heating material that substantially surrounds at least a portion of the PCM element.

23. The method of claim 18, wherein the forming of the PCM element further comprises depositing PCM in one of an amorphous, semi-crystalline or crystalline state.

\* \* \* \* \*